(12) United States Patent
Chan et al.

(10) Patent No.: US 6,545,505 B1
(45) Date of Patent: *Apr. 8, 2003

(54) HYBRID ROUTING ARCHITECTURE FOR HIGH DENSITY COMPLEX PROGRAMMABLE LOGIC DEVICES

(75) Inventors: Caleb Chan, Sunnyvale, CA (US); Richard L. Kapusta, San Jose, CA (US)

(73) Assignee: Cypress Semiconductor Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/940,682

(22) Filed: Sep. 30, 1997

(51) Int. Cl.$^7$ ................................. H03K 19/177
(52) U.S. Cl. .................................. 326/41; 326/39
(58) Field of Search ........................... 326/37, 39, 40, 326/41, 47

(56) References Cited

U.S. PATENT DOCUMENTS

| | | | | |
|---|---|---|---|---|
| 5,260,610 A | * | 11/1993 | Pedersen et al. | 307/465 |
| 5,455,525 A | * | 10/1995 | Ho et al. | 326/41 |
| 5,537,057 A | * | 7/1996 | Leong et al. | 326/41 |
| 5,614,840 A | * | 3/1997 | McClintock et al. | 326/41 |
| 5,966,027 A | * | 10/1999 | Kapusta et al. | 326/39 |

OTHER PUBLICATIONS

Altera, MAX 9000 Programmable Logic Device Family, Data Sheet, Jun. 1996.*

Cypress Semiconductor Corporation Advanced Data Sheet for Ultra 39000 "UltraLogic High Density CPLD Family" (6 pgs. including data sheets for Ultra 39192, Ultra 39256, Ultra 39384 and Ultra 39512) (Oct. 1995).

U.S. patent application 08/940,437, filed Sep. 30, 1997, entitled "Symmetric Logic Block Input/Output Scheme".

Xilinx, "XC4000 Series Field Programmable Gate Arrays", *Product Specification*, Version 1.04, pp. 4–5–4–180, (Sep. 18, 1996).

AMD "The MACH5–256, Fifth Generation MACH® Architecture", *Preliminary*, Publication# 20796, Rev. C, pp. 1–40 (Issue Date: Jan. 1997).

Altera Corporation, "MAX 9000 Programmable Logic Device Family", *Data Sheet*, Ver. 4, pp. 157–191, (6/96).

Altera Corporation, "MAX 9000 Programmable Logic Device Family", *Errata Sheet*, Ver. 2.1, p. 1, (11/95).

Altera Corporation, "FLEX 10K Embedded Programmable Logic Family", *Data Sheet*, Ver. 2, pp. 29–88, (6/96).

Xilinx, "XC9500 In–System Programmable CPLD Family", *Product Information*, Version 1.1, pp. 3–1–3–12 (5/97).

* cited by examiner

*Primary Examiner*—Michael Tokar
*Assistant Examiner*—Anh Tran
(74) *Attorney, Agent, or Firm*—Wagner, Murabito & Hao LLP

(57) ABSTRACT

A scalable routing architecture for high density programmable logic devices involves the utilization of a two-dimensional network of non-segmented routing channels to serve as global interconnects between clusters of logic blocks. Each cluster of logic blocks is a CPLD-like structure which includes a number of logic blocks connected together by a local interconnect. Logic signals that need to enter a cluster, either from an I/O pin or from another logic block of another cluster, do so by traversing from those sources though a channel interconnect. Similarly, logic signals produced by a cluster can be routed to an I/O pin or to another logic block of another cluster across one of the channels. A switch matrix is implemented at intersections between the channels to allow logic signals to be transferred between rows and columns of the channels.

22 Claims, 15 Drawing Sheets

HYBRID ROUTING ARCHITECTURE FOR HIGH DENSITY COMPLEX PROGRAMMABLE LOGIC DEVICES

FIELD OF THE INVENTION

The present invention relates to programmable logic devices and, more particularly, to signal routing schemes within such devices.

BACKGROUND

Various programmable logic architectures are known, including, for example, Programmable Logic Devices ("PLD"), Programmable Logic Arrays ("PLA") and Programmable Array Logic ("PAL™"). Although there are many differences between the various architectures, each of the PLD, PLA and PAL architectures typically include a set of input conductors directly coupled as inputs to an array of logical AND gates ("Product Term Array"), the outputs of which, in turn, act as inputs to another portion of the logic device.

FIG. 1 shows a conventional Complex Programmable Logic Device ("CPLD") 100 which includes a Programmable Interconnect Matrix ("PIM") 110 and eight logic blocks 120. Other CPLDs may include different numbers of logic blocks. As shown, CPLD 100 has a total of 262 inputs, each of which is connected to the PIM 110. The PIM 110 is capable of providing each logic block 120 with its own set of input terms by independently selecting as many as 36 of the possible 262 input signals as input terms for each logic block 120. The compliments for each of the 36 signals output by the PIM 110 are also provided to each logic block 120. Thus, each logic block receives as many as 72 input terms from the PIM 110.

The PIM 110 includes a number of programmable elements (not shown) for controlling an array of multiplexers (not shown) to reduce the total number of programmable elements required. The programmable elements may be volatile memory elements such as static random access memory ("SRAM"), non-volatile memory elements such as flash electrically easrable programmable read only memory ("Flash EEPROM"), or fuses. Alternatively, the programmable elements of the PIM 110 may be implemented to control a matrix of cross point switches; however, this increases the total number of programmable elements required to make the same number of connections. Whether the connections between input conductors and output conductors are provided by cross point switch matrix or by an array of multiplexers, each output conductor can be connected to at least one input conductor. Thus, both forms of connections perform a multiplexing function in the sense of both forms of connection provide for the selection of one of the input conductors from the set of many input conductors.

The 262 inputs to the PIM 110 include 128 feedback signals, 128 input signals and 6 dedicated input signals which include 4 clock signals. Sixteen feedback signals and as many as 16 input signals are provided by each logic block 120. Each logic block 120 is programmed to perform selected logic functions using sub-combinations of the 72 input terms provided by the PIM 110. Each logic block 120 has 16 input/output ("I/O") pins 125, which may be used as either inputs to the PIM 110 or outputs of the CPLD 100.

Conceptually, the CPLD 100 may be regarded as a PIM coupled in series with 8 PLDs coupled in parallel, where each individual logic block 120 corresponds to a single PLD. Intermediate stages in the outputs of each of the 8 PLDs are fed back as inputs to the PIM. Depending on the particular set of input signals routed to the outputs of the PIM and the programmed logic functions for each logic block 120, the 8 PLDs may, in fact, act as two or more PLDs coupled in series with each other. CPLD 100 thus provide a highly versatile logic device.

FIG. 2 shown portions of CPLD 100 in greater detail. Specifically, a logic block 120 is shown as including a product term array 210, a product term allocator 215, macrocells 220 and I/O cells 225. The product term array 210 may be a fully programmable AND array and the product term allocator 215 is configured to allocate product terms from the product term array 210 to 16 macrocells 220. The product term allocator 215 "steers" product terms to macrocells 220 as needed. For example, if one macrocell requires ten products terms while another requires only three product terms, the product term allocator 215 steers ten product terms to one macrocell and three product terms to the other macrocell. Depending on the configuration, up to 16 product terms can be steered to any one macrocell.

The output for each of the 16 macrocells 220 are fed back to the PIM 110 as input signals. The specific architecture of the macrocells 220 may be any appropriate architecture and each macrocell 220 may include registers and/or buffers. The 16 outputs of the macrocells 220 are also fed to 16 I/O cells 225. Each of the 16 I/O cells 225 can be programmed to provide output signals to an I/O pin 125 or input signals to the PIM 110.

CPLD 100, as shown FIGS. 1 and 2, provides a highly versatile programmable logic device. However, as the need for implementing more and more logic functions within digital and/or computer systems has increased, CPLDs of even higher densities have been developed. For example, as shown in FIG. 3, CPLD 300 consists of logic blocks connected by two levels of interconnect. Each group of four logic blocks 310 is given its own routing resource, called a Block Interconnect 320. Together, the four logic blocks 310 and their block interconnect 320 are called a segment 330. The second level of interconnect, segment interconnect 340, ties all of the segments 330 together. Segment interconnect 340 also provides a routing path for a number of global clock signals 350.

Each logic block 310 consists of macrocells, logic arrays, logic allocators, I/O cells and any necessary control signal generators. Thus, each logic block 310 resembles an independent PLD device. In addition to the block interconnect 320, I/O cells associated with each logic block 310 may have signal paths which feed directly back to that logic block (local feedback paths) which may be used to route signals from the I/O cell back to the logic block. When the signals from an I/O cell are used in another logic block, an interconnect feeder may assign a block interconnect line to that signal. The interconnect feeder may act as an input switch matrix.

The block interconnect 320 and segment interconnect 340 provide connections between any two signals in CPLD 300. Block interconnect lines and local feedback lines are assigned as required.

Although CPLD 300 provides a high degree of flexibility for implementing logic functions, it also suffers from certain drawbacks. For example, segment interconnect 340 and block interconnect 320 are each multiplexer-based interconnect structures. As such, segment interconnect 340 and block interconnects 320 require significant die area, thus leading to increased fabrication costs for CPLD 300. Segment interconnect 340 is required to be multiplexer-based because of the need to provide interconnection between every logic block 310 of CPLD 300. Although such a scheme may provide maximum connectability, it tends to ignore "real-world" designs which typically implement related logic functions in related logic blocks of a segment, thus avoiding the need to transmit numerous signals across an interconnect between segments. What is desired, therefore, is an improved routing architecture for high density CPLDs which avoids such drawbacks.

SUMMARY OF THE INVENTION

The present invention provides scalability for the routing architectures of complex programmable logic devices as they increase in density. A new routing architecture which reduces silicon die area and delay over that of conventional CPLDs, while maintaining the same routing flexibilities for most logic signals within the device, is provided. The novel routing architecture involves the utilization of a two-dimensional network of nonsegmented routing tracks or channels to serve as global interconnects between clusters of logic blocks. Each cluster of logic blocks is a CPLD-like structure which includes a number of logic blocks connected to a local interconnect. Logic signals that need to enter a cluster, either from an I/O pin or from another cluster of logic blocks, do so by traversing from those sources though a channel interconnect. Similarly, logic signals produced by a cluster can be routed to an I/O pin or to another logic block of another cluster across one of the channels. A switch matrix is implemented at intersections between the channels to allow logic signals to be transferred between rows and columns of the channels.

Accordingly, in one embodiment, the present invention provides a programmable logic device which includes a number of clusters of logic blocks, each of the clusters having a respective programmable interconnect matrix. Each of the logic blocks of each cluster are coupled to the cluster's respective programmable interconnect matrix. Each of the clusters are coupled to other clusters though a row and column, non-segmented routing matrix. The row and column routing matrix may be symmetrical and may further be coupled to a number of input/output blocks. The row and column routing matrix is made up of a number of programmable interconnections.

In a further embodiment, the present invention provides an hierarchical routing scheme for a programmable logic device. The routing scheme includes a first level routing architecture configured to provide intercommunication between a plurality of logic blocks of a first cluster and a second level routing architecture configured to provide limited intercommunication between the first cluster and a second cluster of logic blocks. The second level routing architecture comprises a row and column routing matrix. The row and column routing matrix may be non-segmented and/or symmetrical. The first level routing architecture may be configured to provide intercommunication between the plurality of logic blocks of a cluster and the second level routing architecture.

These and other features and advantages of the present invention will become apparent from a review of the drawings and the detailed description which follows.

BRIEF DESCRIPTION OF THE DRAWINGS

The present invention is illustrated by way of example, and not limitation, in the figures of the accompanying drawings in which.

DETAILED DESCRIPTION

Described herein is a hybrid routing architecture for a high density complex programmable logic device. The present invention provides scalability for the routing architectures of complex programmable logic devices as they increase in density. A new routing architecture which reduces silicon die area and delay over that of conventional CPLDs, while maintaining the same routing flexabilities for most logic signal within the device, is provided.

The novel routing architecture involves the utilization of a two-dimensional network of non-segmented routing tracks or channels to serve as global interconnects between clusters of logic blocks. Each cluster of logic blocks is a CPLD-like structure which includes a number of logic blocks connected together by a local interconnect. Logic signals that need to enter a cluster, either from an I/O pin or from another logic block, of another cluster do so by traversing from those sources though a channel interconnect. Similarly, logic signals produced by a cluster can be routed to an I/O pin or to another logic block of another cluster across one of the channels. A switch matrix is implemented at intersections between the channels to allow logic signals to be transferred between rows and columns of the channels.

Figure 4:
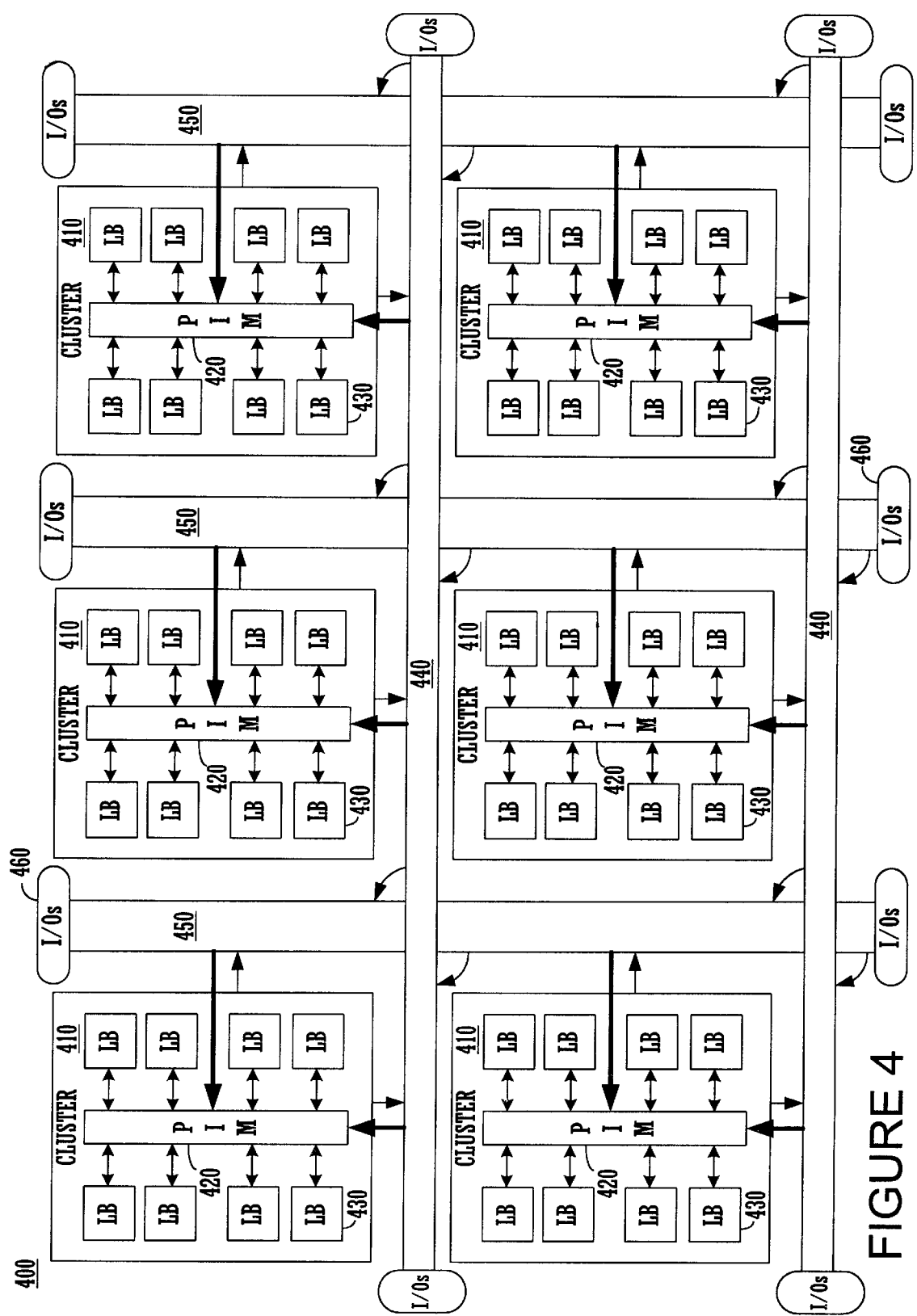
FIG. 4 illustrates a high density complex programmable logic device having a scalable routing architecture according to one embodiment of the present invention.

FIG. 4 shows a high density complex programmable logic device (CPLD) 400 incorporating these and other features of the present invention. CPLD 400 may be implemented on a single semiconductor die. CPLD 400 includes a plurality of clusters of logic blocks 410. Each cluster 410 includes a programmable interconnect matrix (PIM) 420 and a number of logic blocks 430. Although in FIG. 4 eight logic blocks 430 are shown for each cluster 410, it should be appreciated that a cluster 410 may include any number of logic blocks, preferably more than two, and in some cases four or more.

Figure 1:
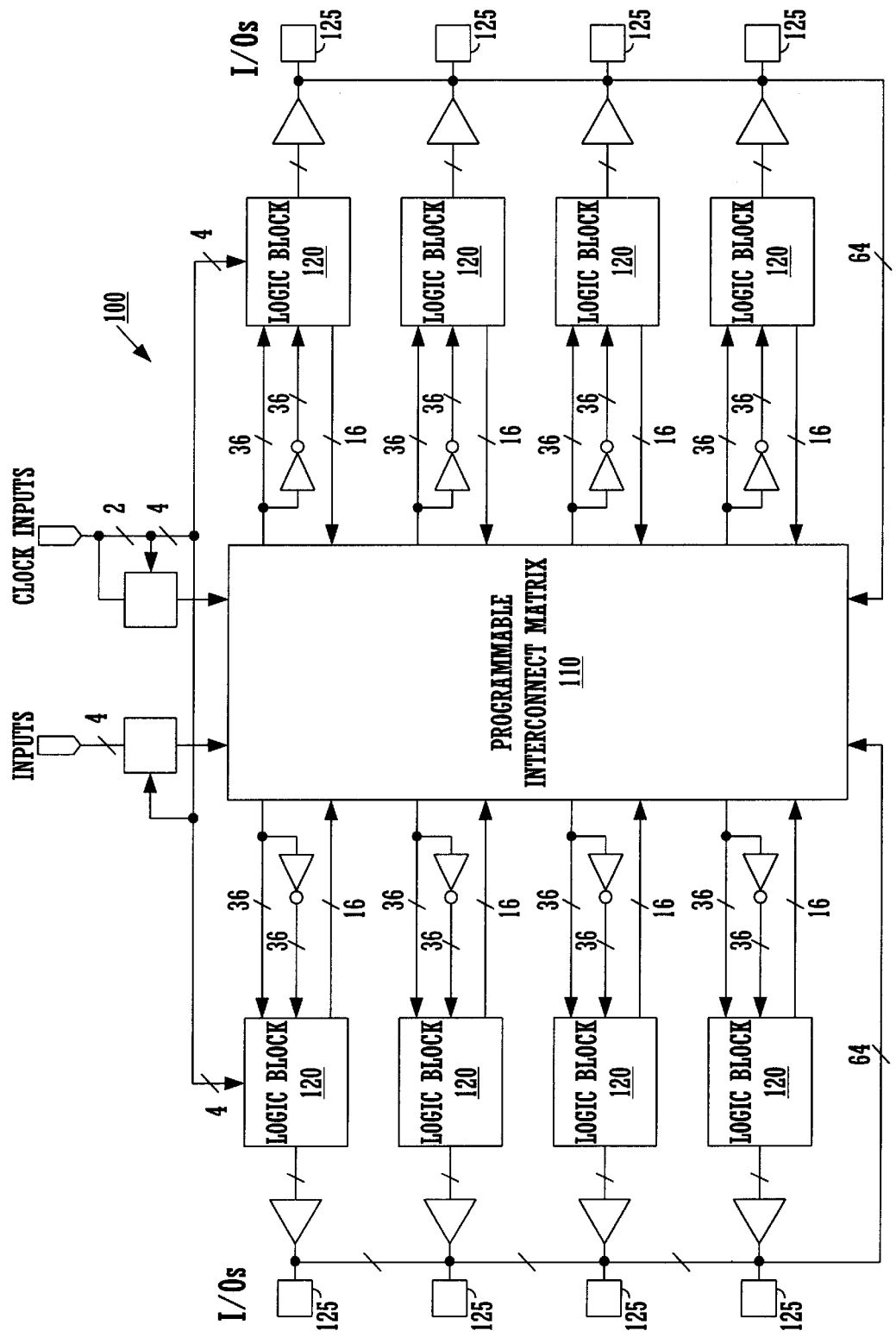
FIG. 1 illustrates a conventional complex programmable logic device layout.
Figure 2:
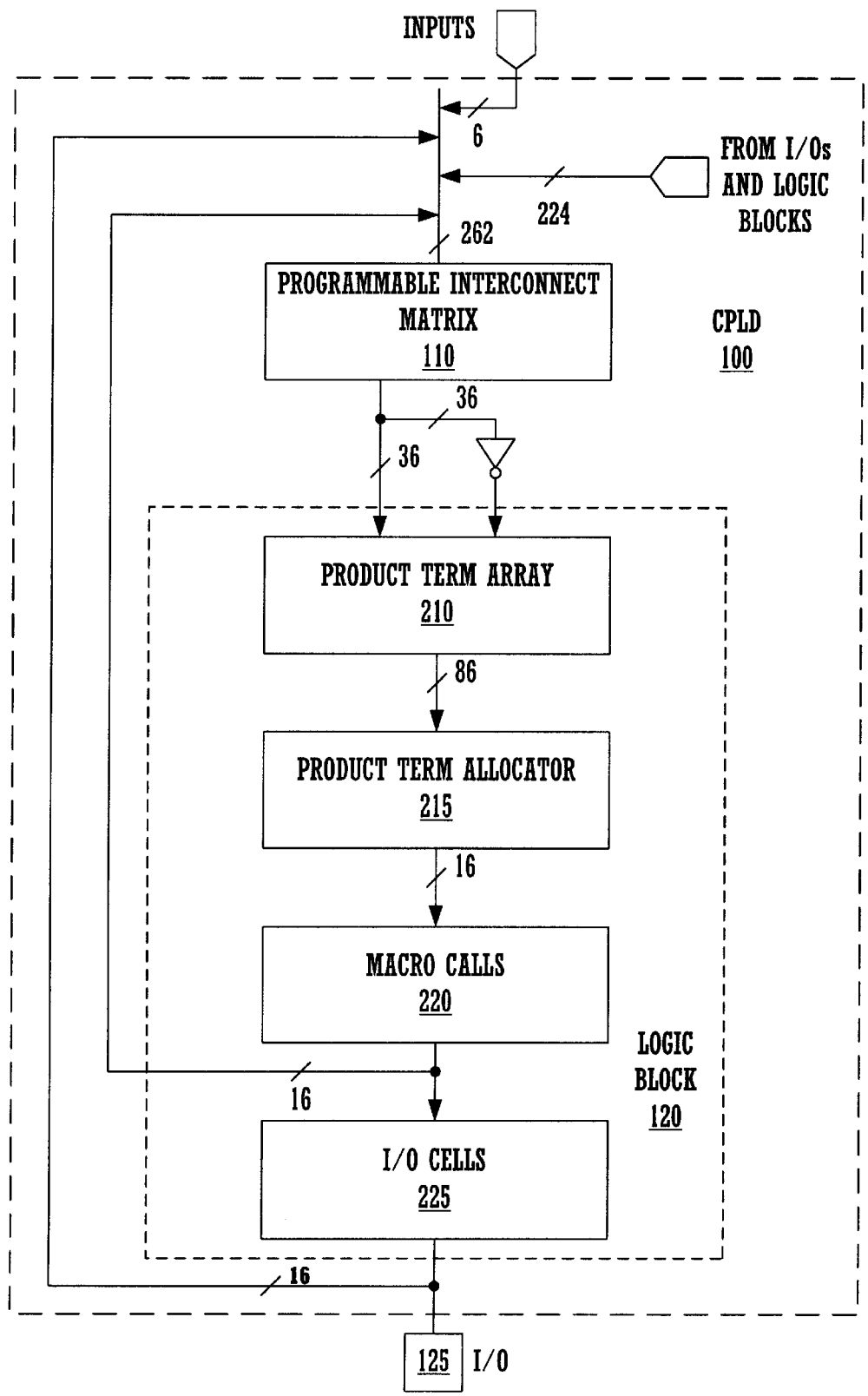
FIG. 2 illustrates a conventional complex programmable logic device signal path.

Thus, each cluster 410 may resemble a complex programmable logic device such as that illustrated in FIG. 1. Further, it should be appreciated that although CPLD 400 is shown in FIG. 4 as including six clusters of logic blocks 410, it should be appreciated that any number of clusters 410 may be included, preferably more than two, and in some cases six or more or eight or more.

Each PIM 420 includes a number of programmable elements (not shown) for controlling an array of multiplexers (not shown) to reduce the total number of programmable elements required. The programmable elements may be volatile memory elements such as static random access memory (SRAM), nonvolatile memory elements such as flash electrically erasable programmable read only memory ("Flash EEPROM"), antifuses or fuses. Alternatively, the programmable elements of each PIM 420 may be implemented to control a matrix of cross point switches.

Each logic block 430 may be programmed to perform selected logic functions using sub-combinations of the inputs provided by the PIM 420. Thus, each cluster 410 may be regarded as a PIM coupled in series with a number of programmable logic devices coupled in parallel, wherein each logic block 430 corresponds to a single programmable logic device. Intermediate stages and the outputs of each of the programmable logic devices are fed back as inputs to the PIM 420. Depending on the particular set of input signals routed to the outputs of the PIM 420 and the programmed logic functions for each logic block 430, the individual programmable logic devices may, in fact, act as two or more programmable logic devices coupled in series with each other. Each cluster 410 thus provides a highly versatile logic device in and of itself.

Each cluster 410 is also coupled to a second level routing architecture which includes channels 440 and 450. Channels 440 and 450 make up a row and column (respectively), non-segmented routing matrix. Each channel 440 and 450 may include the same number of non-segmented interconnects, thus making the row and column routing matrix symmetrical in nature. In other embodiments, different numbers of individual interconnects may be included within each channel 440 or 450. For example, in one embodiment each vertical channel 450 may include from 182 to 208 individual interconnects while each horizontal channel 440 may include from 273 to 289 individual interconnects. The exact number of interconnects to be included in any channel 440 or 450 is a design choice and will depend on the overall layout of CPLD 400. For example, different numbers of interconnects may be required to accomodate memory elements associated with one or more clusters. In general, however, the second level routing achritecture provides only for limited intercommunication between clusters 410.

Access to an individual cluster 410 from one of the channels 440 or 450 is though a cluster's respective PIM 420. Thus, each PIM 420 is configured to provide intercommunication between its plurality of the associated logic blocks and the second level routing architecture. Access from an individual cluster 410 to one of the channels 440 or 450 is via a logic block 430. A switch matrix is implemented at every interconnection between a row and a column of the second level routing architecture. This allows logic signals to be transmitted from channel 450 to channels 440, or vice versa. This layout of the second level routing architecture allows for an example of signals between adjacent clusters 410 to be very rapid because such signals need not pass through both a row and column channel.

Figure 3:
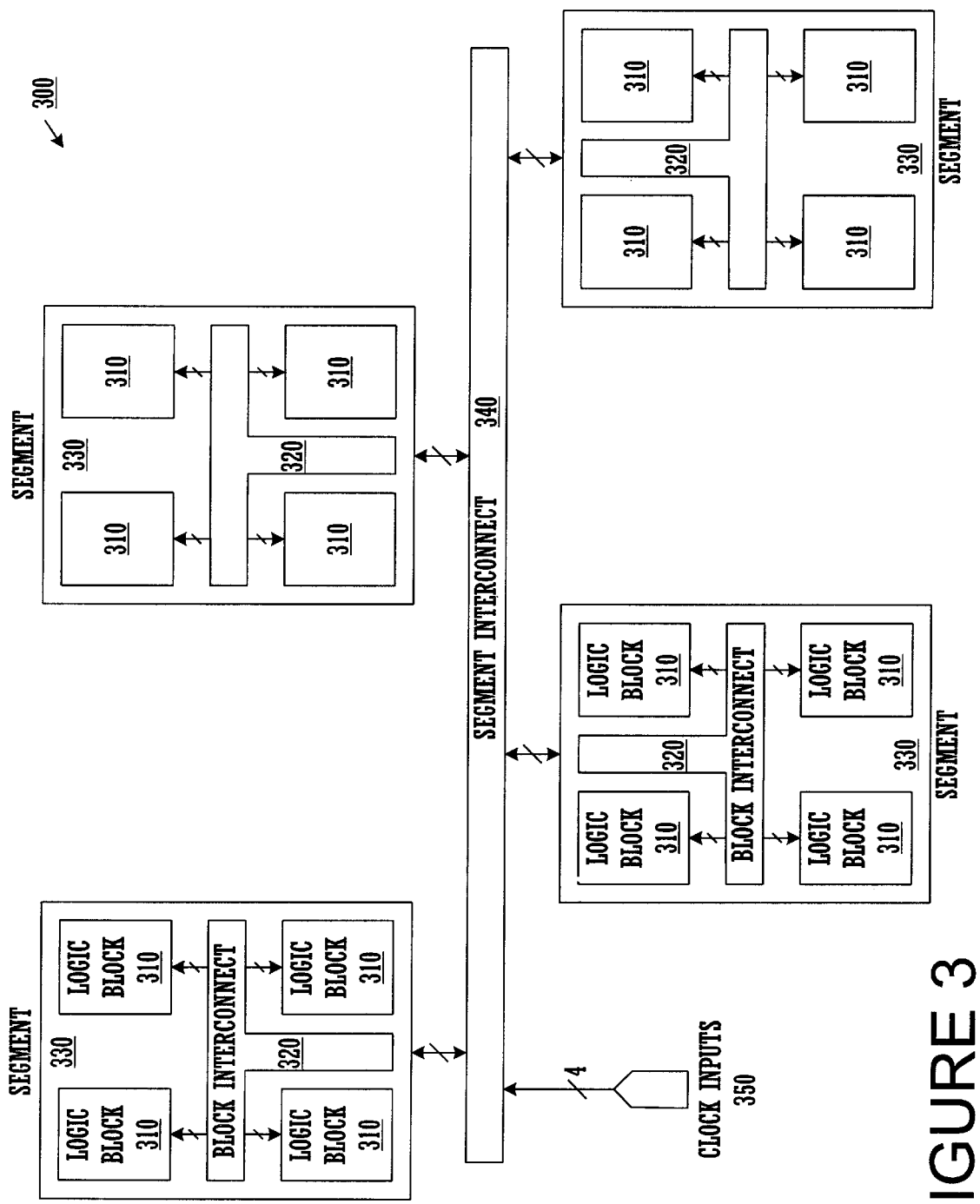
FIG. 3 illustrates a high density complex programmable logic device employing block and segment, multiplexer-based interconnect structures.

The advantage of this hybrid routing architecture is that by choosing a cluster size (i.e., the number of logic blocks 430 per cluster 410) that will encompass a high percentage of logic signals, those signals that are local to a cluster 410 will be able to take advantage of the high routing flexibility of the multiplexer-based local PIM 420. For the few global signals that need to travel across cluster boundaries, a low cost (in terms of silicon die area and delay) channel-based interconnect scheme is used. In contrast, schemes such as that shown in FIG. 3 that contain only CPLD-type, multiplexer-based interconnects incur much higher silicon die area and delay costs for the same device density. Other schemes that contain only field programmable gate array (FPGA)-type, channel-based interconnects will have lower routing flexibilities for all logic signals in the device due to the absence of local interconnects such as PIM 420. Thus, the hybrid hierarchical routing architecture (i.e., one made up of a local interconnect per cluster and a cluster interconnect) provides an optimization for a high density programmable logic device 400.

Accordingly, in one embodiment, the present invention provides a programmable logic device which includes a number of clusters of logic blocks, each of the clusters having a respective programmable interconnect matrix. Each of the logic blocks of each cluster are coupled to the cluster's respective programmable interconnect matrix. Each of the clusters are coupled to other clusters though a row and column, non-segmented routing matrix. The row and column routing matrix may be symmetrical and is made up of a number of programmable interconnections as described further below.

As shown in FIG. 4, CPLD 400 also includes a number of I/O blocks 460. The I/O blocks 460 are coupled to the channels 440 and 450 and each includes a number of input/output pins which may be used as either inputs to a cluster 410 or outputs of the CPLD 400.

Figure 5:
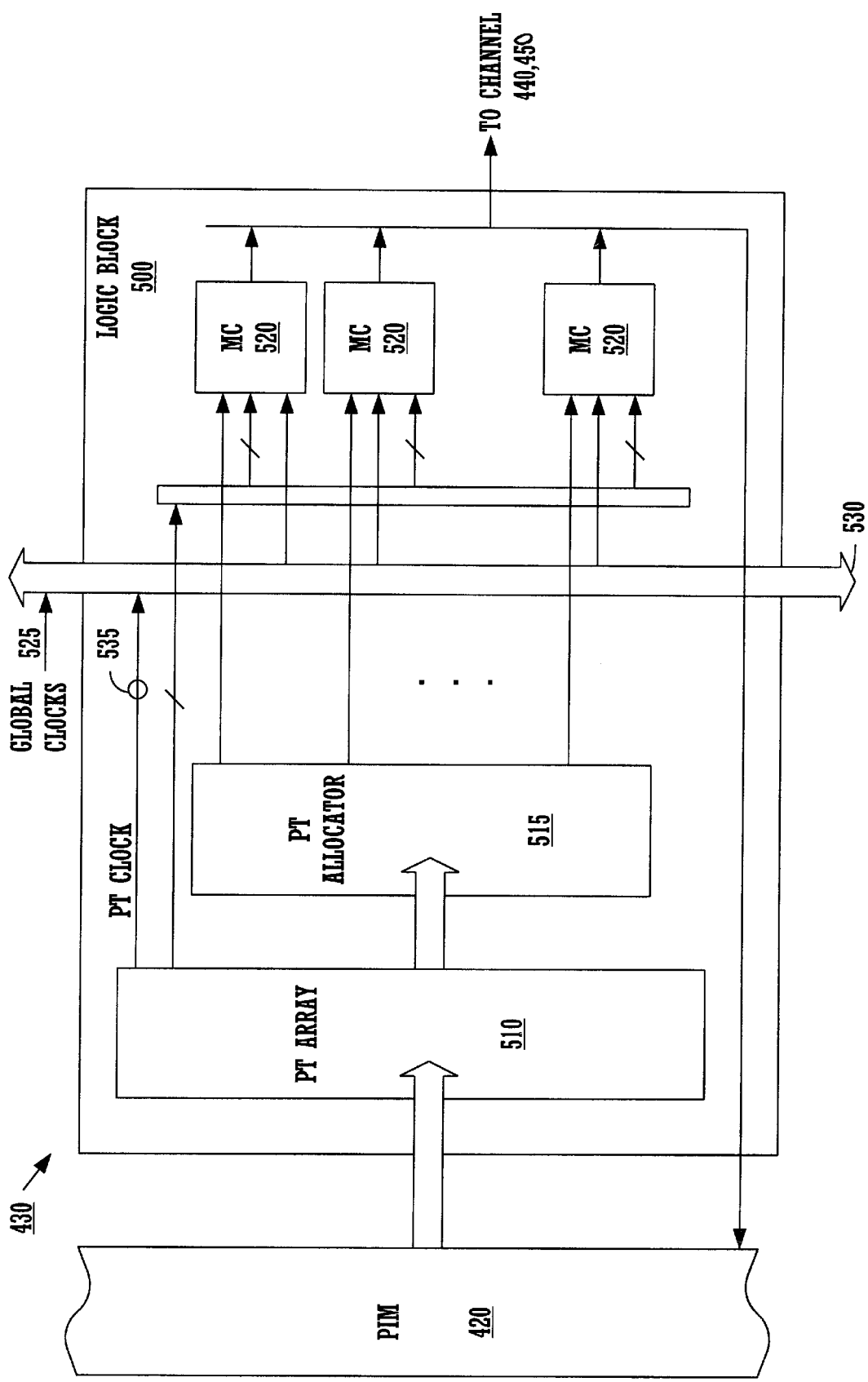
FIG. 5 illustrates an exemplary logic block for the complex programmable logic device of FIG. 4.

FIG. 5 shows the portions of a cluster 430 in greater detail. Specifically, an exemplary logic block 500 is shown as including a product term array 510, a product term allocator 515 and a number of macrocells 520. Signals from a local PIM 420 are routed to the product term array 510 which may be a fully programmable AND array. Product term allocator 515 allocates product terms from the product term array 510 to the macrocells 520. For each logic block 500, 16 macrocells 520 may be included. Product term allocator 515 steers product terms to the macrocells 520 as needed. For example, if a first macrocell 520 requires ten products terms while a. second macrocell 520 requires three product terms, the product term allocator 515 steers ten product terms to the first macrocell and three product terms to the second macrocell. For one embodiment, up to 16 product terms can be steered to any one macrocell 520.

The outputs for each of the macrocells 520 are fed back to the PIM 420 as input signals. In addition, product terms may be fed directly to the macrocells 520 from the product term array 510. For timing purposes, global clock signals 525 are provided on a global clock bus 530 to each of the macrocells 520. The global clock signals 525 may be common to an entire cluster or to multiple clusters. Individual product term clock signals 535 may be provided to the macrocells 520 from the product term array 510.

Figure 6:
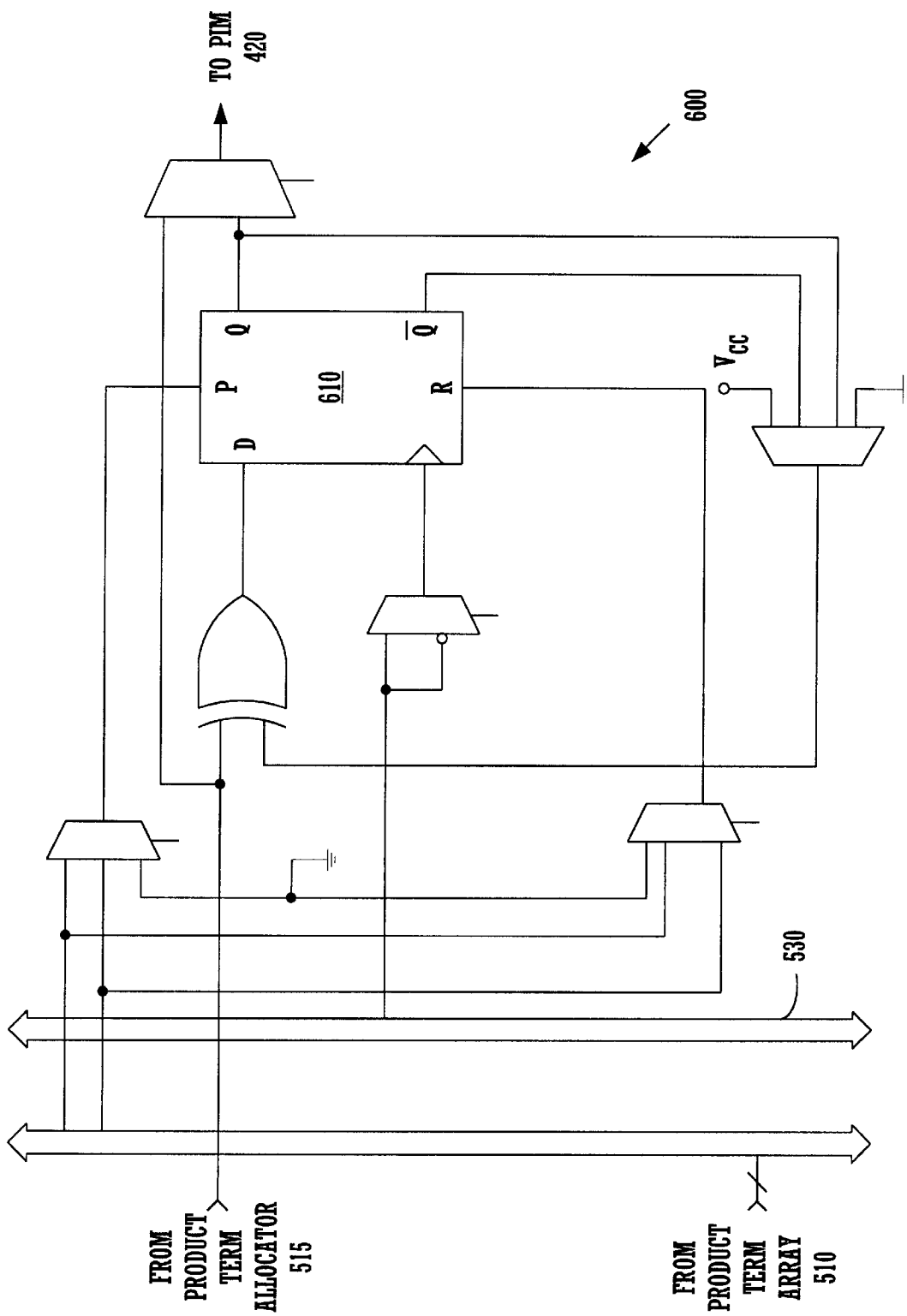
FIG. 6 illustrates an exemplary macrocell for the complex programmable logic device of FIG. 4.

FIG. 6 illustrates an exemplary macrocell 600 in more detail. As shown, macrocell 600 may include any appropriate architecture for implementing desired logic functions. For example, a register 610 may be provided and configured to receive inputs from product term allocator 515. Clock signals may be provided to operate register 610 from a global clock bus 530 and other timing signals, for example to reset register 610, may be provided from product term array 510. Various multiplexers and/or logic gates, as shown in FIG. 6, may be used to achieve desired logic and/or timing functions to produce output signals which are ultimately routed back to a local PIM 420.

Figure 7:
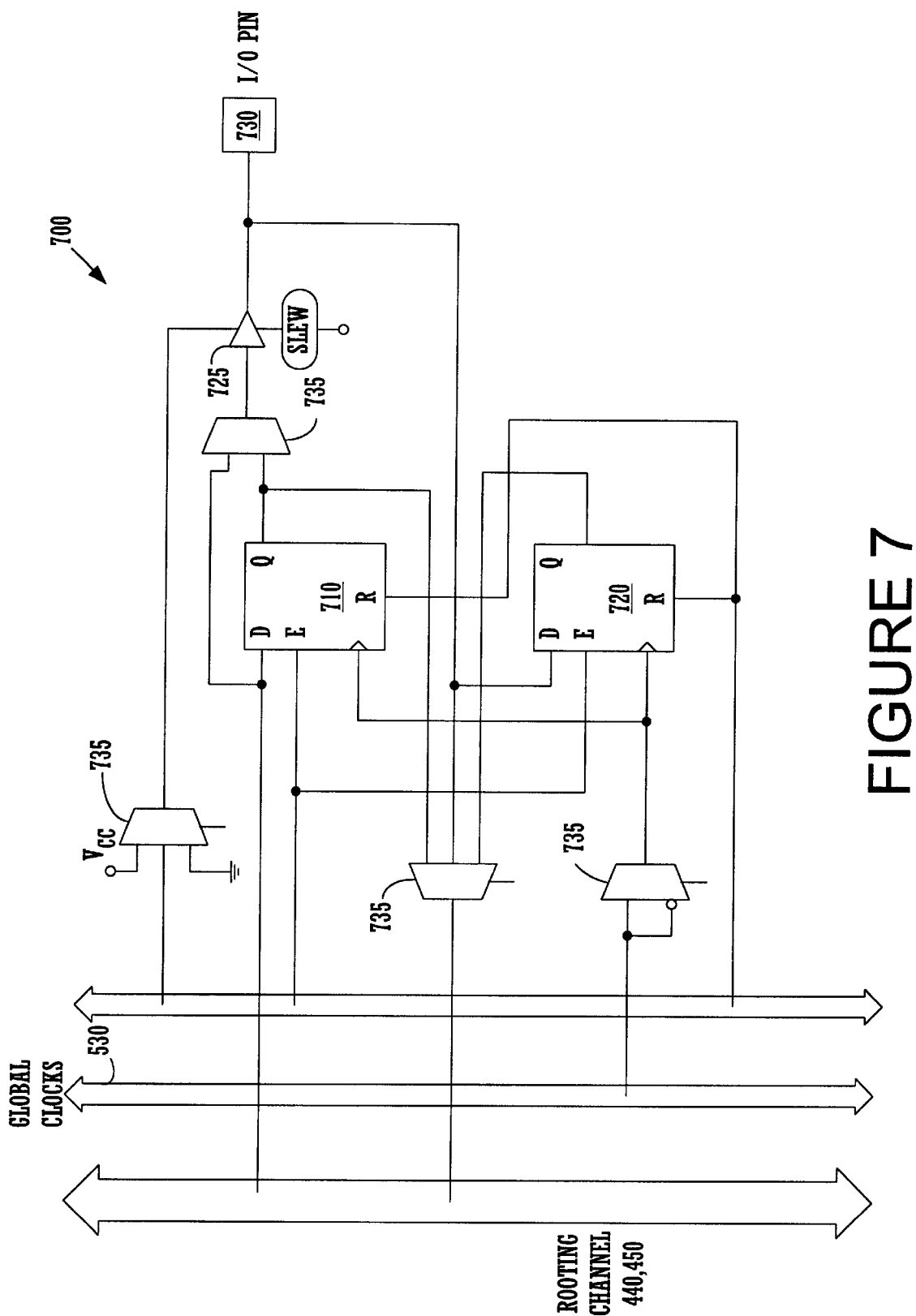
FIG. 7 illustrates an exemplary I/O block for the complex programmable logic device of FIG. 4.

FIG. 7 illustrates an exemplary I/O cell 700 for CPLD 400. The outputs of macrocells, for example, may be fed though routing channels 440 and/or 450 to an I/O cell 700. Each of the I/O cells 700 may include various registers 710 and 720 as well as a three state output buffer 725 coupled to an I/O pin 730. Each I/O cell 700 may be programmed to change the way the output buffer 725 is enabled and/or disabled. Inputs or outputs of the I/O cells 700 may be fed back to the routing channels 440 or 450 as desired. Further, the use of various multiplexers 735 allows for the control of the timing of register 710 or 720 to achieve desired input and/or output functions.

Figure 8:
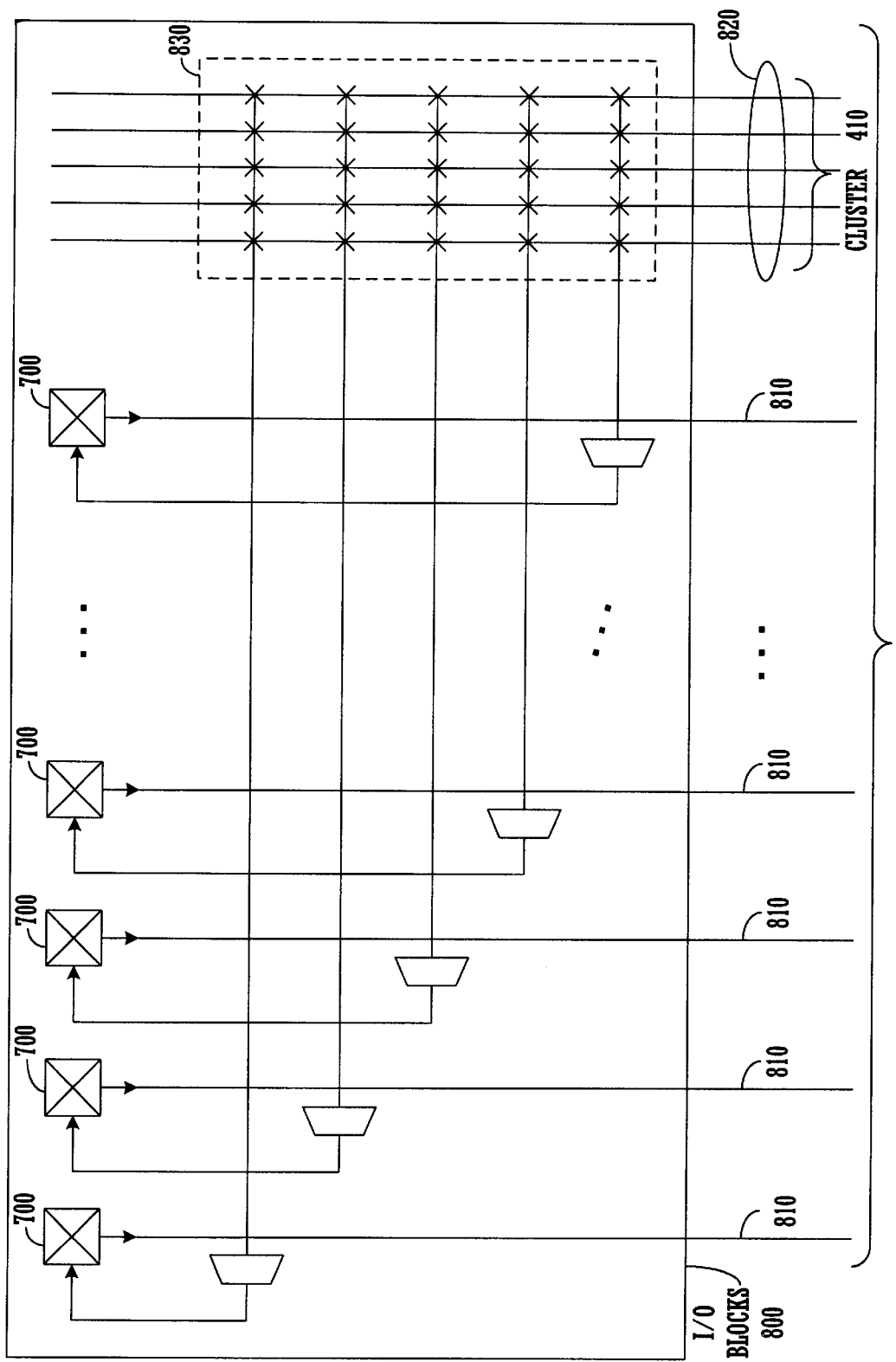
FIG. 8 illustrates an exemplary I/O block-to-channel connection for the complex programmable logic device of FIG. 4, according to one embodiment of the present invention.

As shown in FIG. 8, a number of I/O cells 700 make up an I/O block 800 which is coupled to a routing channel 440 or 450. Each I/O cell 700 within an I/O block 800 is provided with an output to the routing channel 440 or 450 and each I/O cell 700 may receive inputs from the channels 440 or 450 from one or more of the clusters 410.

Each output 810 for an I/O cell 700 is a dedicated line or interconnect in one of the routing channels 440 or 450. These outputs 810 may be used to provide signals to any of the clusters 410. Similarly, any of the clusters 410 may provide signals to any of the I/O cells 700 of an I/O block 800 using signal paths 820 which are also part of routing channel 440 or 450. In FIG. 8, the interconnections illustrated in area 830 show that though the use of programmable interconnections, various signals 820 may be provided to I/O cells 700. These connections perform a multiplexing function in the sense that they provide for the selection of one input conductor from a set of many input conductors. Therefore, as used in this context, the term "multiplexer" or the illustration of multiplexer in FIG. 8 should be understood to encompass any circuit that performs a multiplexing function, regardless of the number of programmable elements required to control that circuit. Preferably, the programmable elements and/or the multiplexing function may be implemented as volatile memory elements such as static random access memory.

Figure 9A:
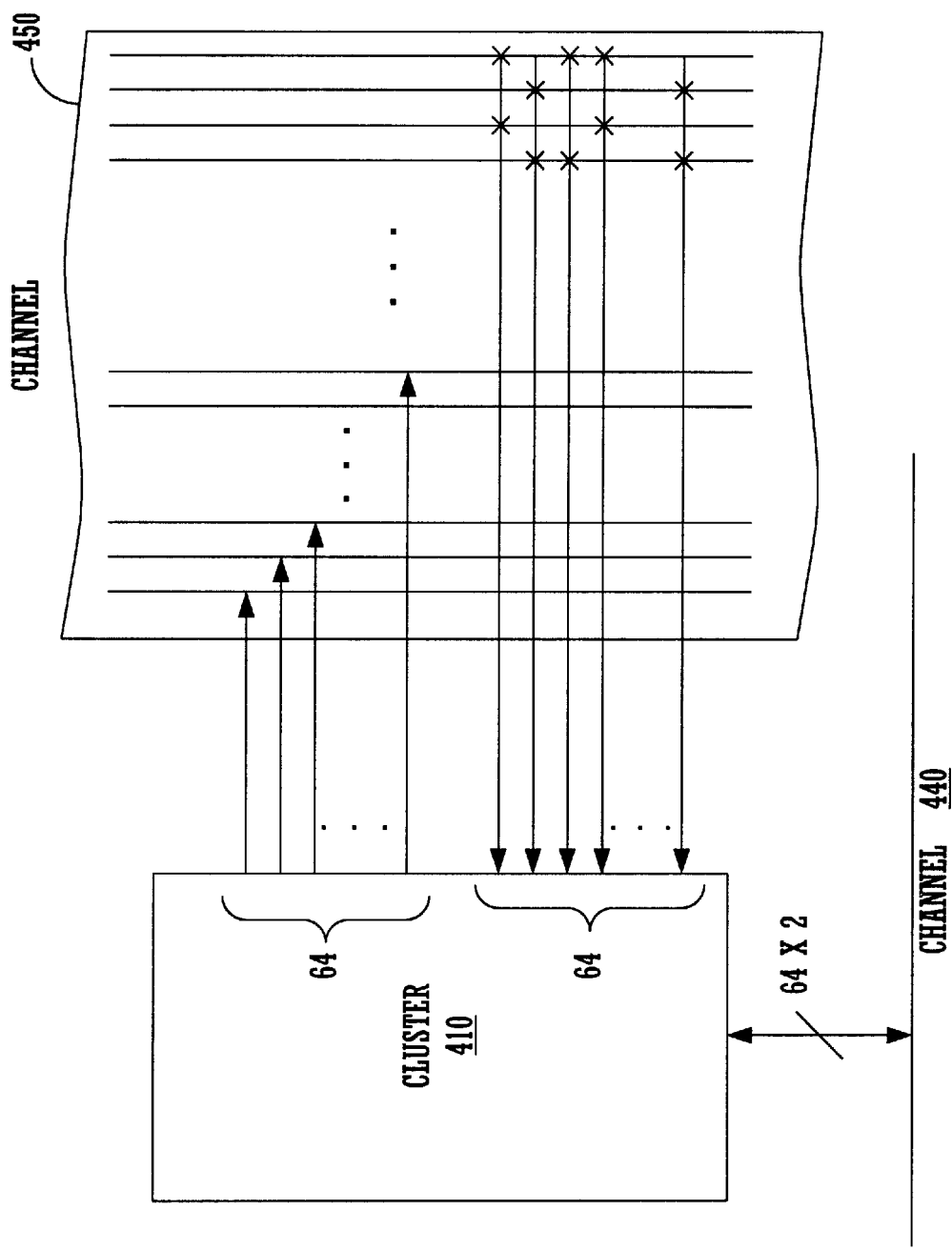
FIG. 9a illustrates an exemplary cluster-to-channel connection for the complex programmable logic device of FIG. 4, according to one embodiment of the present invention.

FIG. 9a illustrates the interconnection of cluster 410 to channels 440 and 450. The interconnection between these elements of CPLD 400 may be provided through a local PIM 420 within cluster 410. As shown, channel 440 is a row within the second level routing architecture. Conceptually, 64 bidirectional interconnections may be provided to couple channel 440 to cluster 410. The interconnection of cluster 410 to channel 450 (a column within the second level routing architecture) may be similar to that between cluster 410 and channel 440. For example, as illustrated in FIG. 9a, cluster 410 includes 64 dedicated outputs to channel 450, each output corresponding to an individual conductor within channel 450. Thus, up to 64 signals from cluster 410 may be routed to channel 450. Similarly, cluster 410 may receive up to 64 inputs from channel 450. However, the inputs will generally be received from conductors in channel 450 other than those associated with the dedicated outputs of cluster 410. This is because there is no need to route signals outside of cluster 410 to be used as inputs to cluster 410 because local PIM 420 provides such interconnection for signals within cluster 410.

Figure 11:
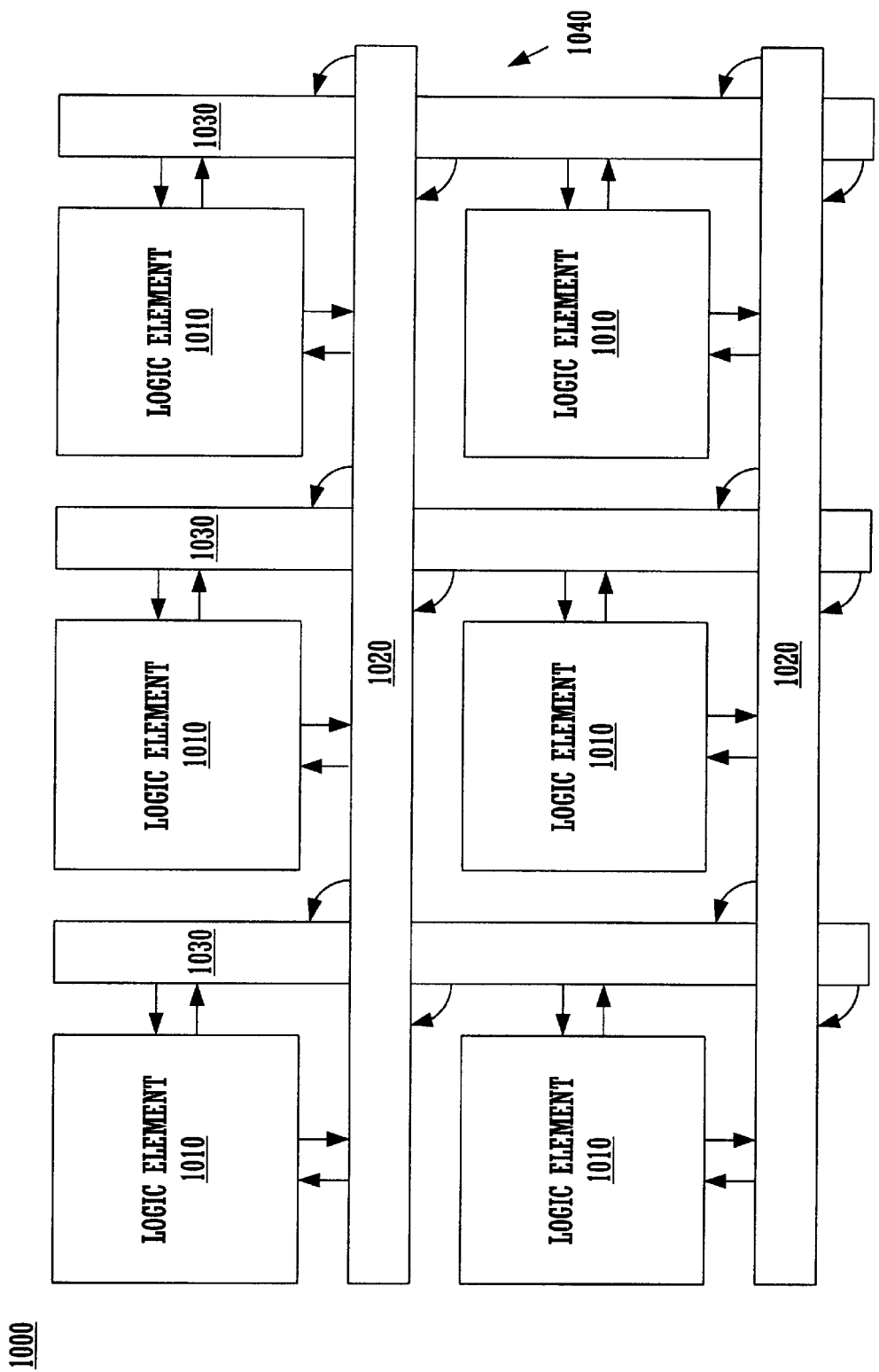
FIG. 11 illustrates a symmetrical interconnection scheme for logic elements of a programmable logic device.

The symmetrical interconnection of a cluster 410 to a row 440 and column 450 of the global interconnect is one example of a broader aspect of the present invention. In general, the present invention provides a means for symmetrically interconnecting a logic element of a programmable logic device to a row and column of a global interconnect. This is illustrated in FIG. 11 which shows a programmable logic device 1000 having a plurality of logic elements 1010, each having a symmetrical interconnection to a row 1020 and column 1030 of a global interconnect matrix 1040. As used herein, the term symmetrical interconnection means that signals may be passed to/from a logic element 1010 from/to a row 1020 and column 1030 of the global interconnect matrix 1040 with equal ease. One implementation provided functional bi-directional couplings between the logic element 1010 and the row 1020 and column 1030 of the global interconnect matrix. The individual logic elements 1010 may be clusters of logic blocks, individual logic blocks, pluralities of logic blocks (e.g., arranged in configurations other than a cluster), memory cells, blocks of memories (e.g., dual port memories, first-in-first-out memories, etc.), registers, gates, multiplexers or other elements of a programmable logic device or any combination thereof. Further, the logic elements may be arranged in different configurations, such as a 4×4 matrix, 2×3 matrix, 20×20 matrix, etc.

Thus, FIG. 9a illustrates an exemplary aspect of the present invention wherein a symmetrical interconnection is provided for a cluster 410 to channels 440 and 450. This aspect of the present invention allows signals to be passed to or from a cluster to a vertical or horizontal channel with equal ease. In addition to providing greater flexibility for routing signals with CPLD 400, such a scheme also allows for easier fabrication by providing uniformity at all cluster-to-channel interconnections.

Figure 10A:
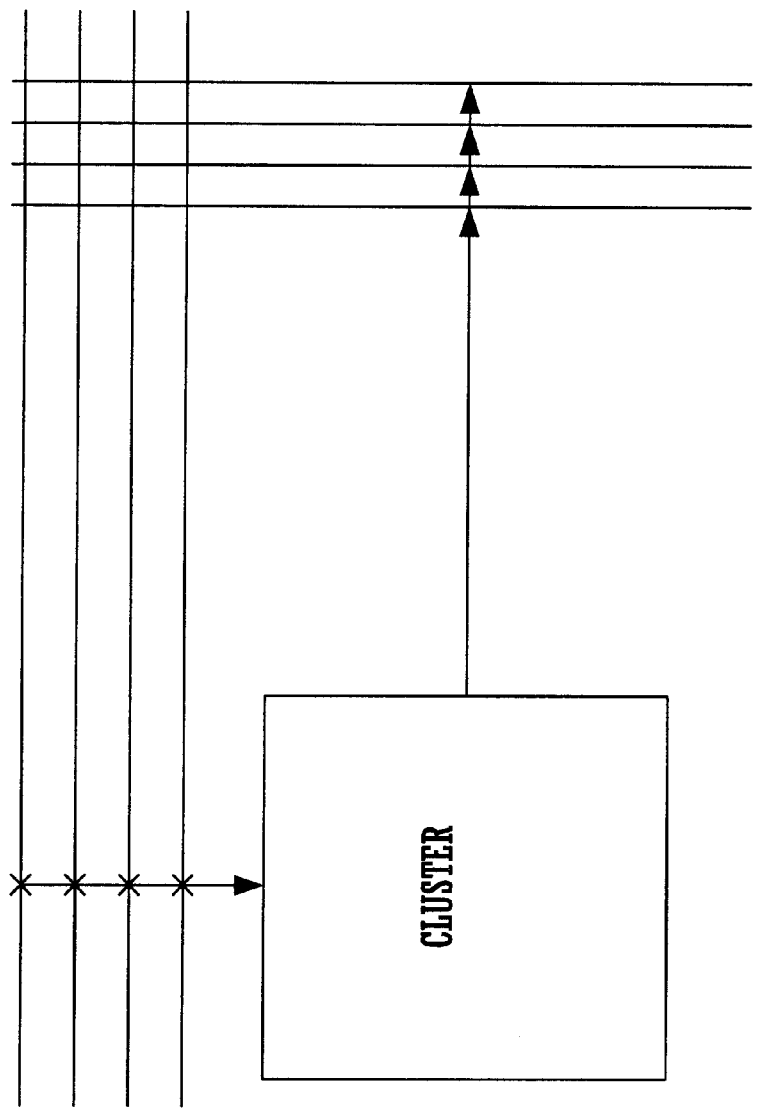
FIGS. 10a, 10b and 10c illustrates conventional cluster-to-channel connection schemes.
Figure 10B:
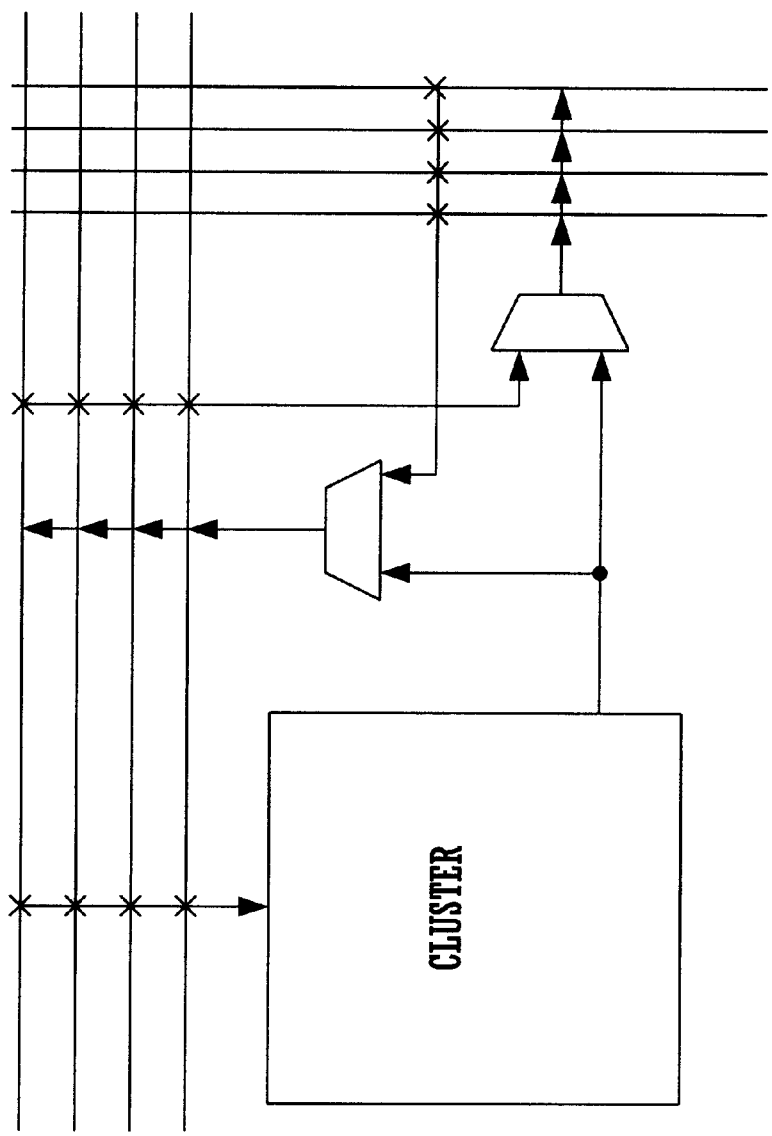
Figure 10C:
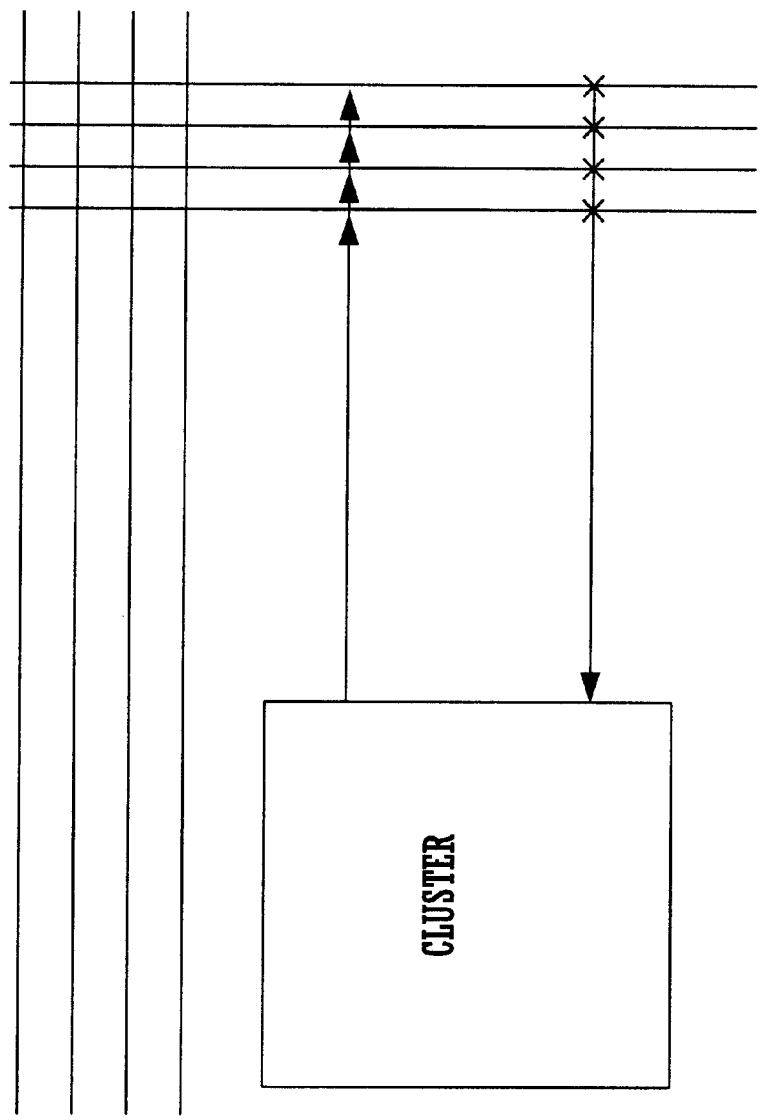

The symmetrical interconnection of a cluster 410 to channels 440 and 450 also provides a departure from and an improvement over schemes of the past. Traditionally, in high density logic devices, signals from logic blocks have been restricted to enter or exit a cluster in one of these ways. As shown in FIG. 10a, one scheme allows logic signals to enter a cluster from channels on one side and exit on the other side. Another scheme, illustrated in FIG. 10b, allows logic signals to enter a cluster from channels on only one side. In this scheme, signals can exit to channels on either side of the cluster but such signals compete with other signals in the channels that need to make a "turn" from a column to a row. Finally, schemes such as that shown in FIG. 10c allow signals to enter/exit a cluster from/to a channel on only one side of the cluster. The present invention provides advantages over each of these schemes.

For example, by allowing signals traveling to/from the second level routing architecture to exit/enter through two separate points of a logic cluster 410, the present invention achieves reduced signal delay, increased routability and enhanced pin-locking capability. Improved signal delay is achieved because the present invention reduces potential delay for global signals. That is, signals may now enter or exit a cluster from alternate directions, avoiding the need to compete with other global signals in the channels, for example, signals can now be directed to a particular column or row, avoiding the need to pass through a channel switching box. Increased pin-locking capability is achieved as signals that are locked to either a column-or row-related I/O block 460 can enter a cluster 410 without having to go through a channel switch box. Increased global routability is achieved because signals that cannot enter/exit a cluster due to channel traffic congestion can still enter/exit through an alternate route.

The 64 inputs to cluster 410 from channel 450 are illustrated in FIG. 9a in a fashion similar to that shown for I/O block 800 in FIG. 8. That is, programmable elements may be used to provide routing between conductors within channel 450 and the inputs to cluster 410.

Figure 9B:
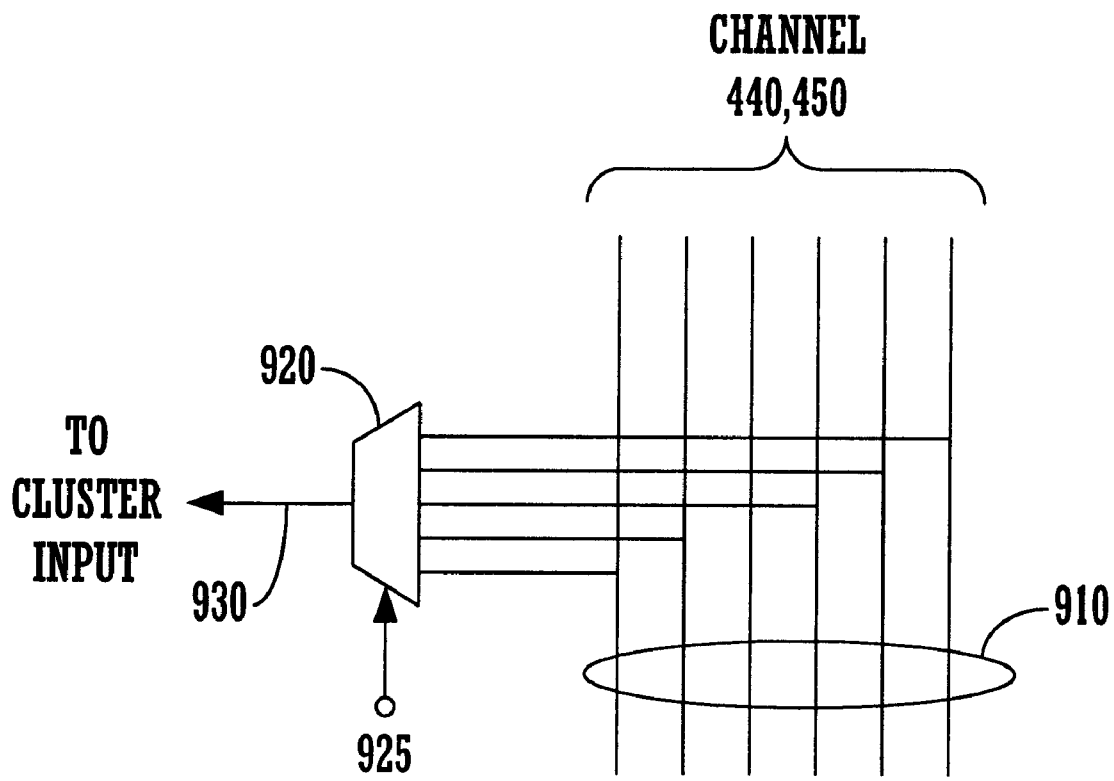
FIG. 9b illustrates a channel-to-cluster input in greater detail.

This concept is further illustrated in FIG. 9b. As shown, conductors 910 within a channel 440 or 450 may be provided as inputs to a multiplexing function 920 under the control of a programmable element 925. Using programmable element 925, an individual signal from one of the conductors 910 may be provided to an individual cluster input 930. The programmable element 925 may be a volatile memory element such as an SRAM, a non-volatile element such as a Flash EEPROM, a fuse or an antifuse. Alternatively, a matrix of cross point switches may be used. Further, the multiplexing function itself may be performed through the use of programmable elements, such as SRAM. Regardless of the individual structure, however, it is the multiplexing function which is performed, in the sense that there is a selection of one input conductor from a set of many inputs conductors, that is important.

Figure 9C:
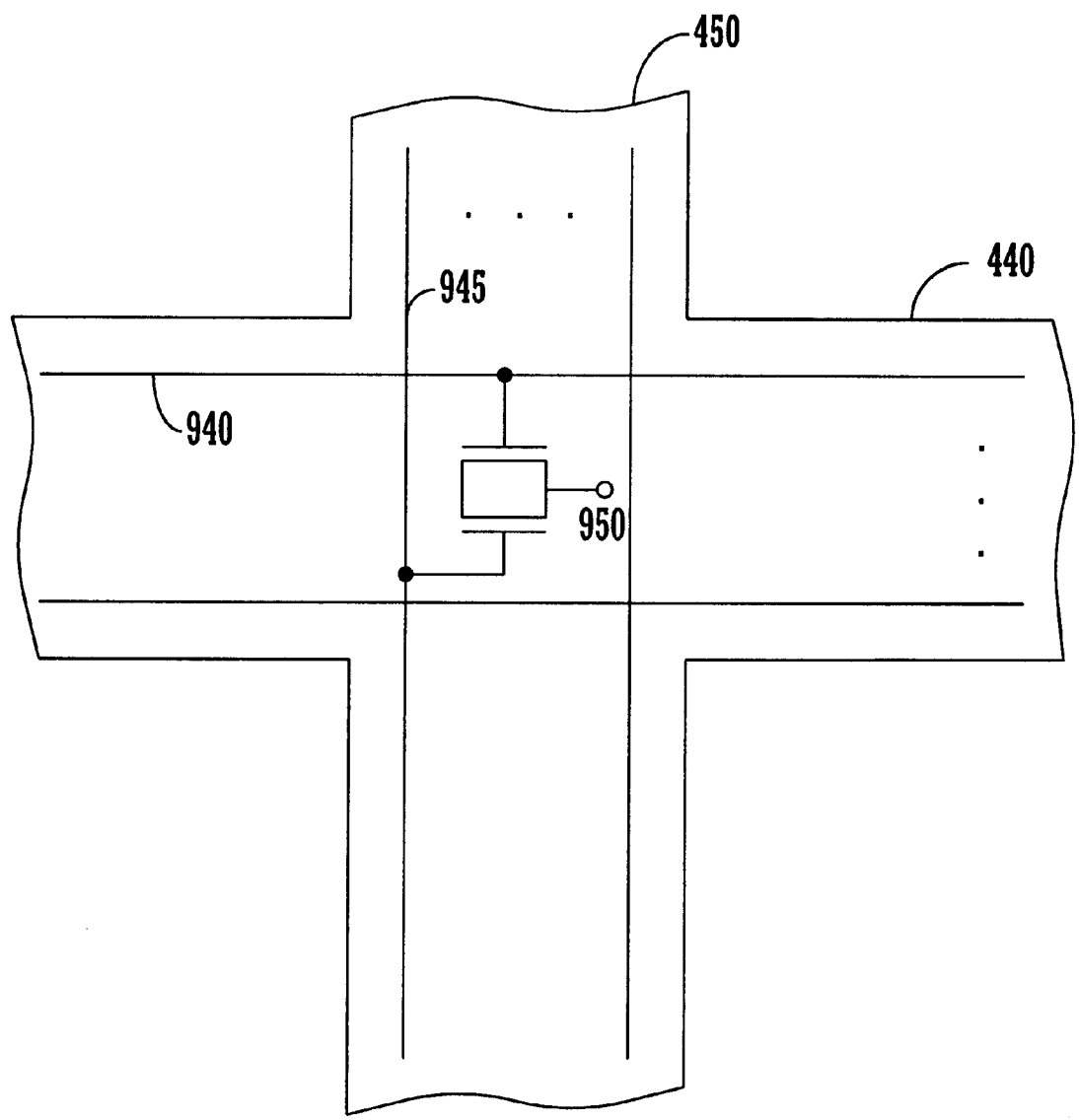
FIG. 9c illustrates a channel-to channel connection for the complex programmable logic device of FIG. 4, according to one embodiment of the present invention.

FIG. 9c shows the routing of signals between a row channel 440 and a column channel 450. Individual conductors 940 within channel 440 and 945 within channel 450 may need to be connected. This may be accomplished through the use of a passgate or similar device 950 under the control of a programmable element. Again, the programmable element which controls passgate 950 may be a volatile memory element such as an SRAM, a non-volatile memory element such as a Flash EEPROM, a fuse or an antifuse. When a programmable element is programmed, passgate 950 provides an interconnection between conductors 940 and 945, thus enabling signals to be routed from channel 450 to channel 440 or vice verse. When the programmable element is not programmed, no such interconnection is provided.

Thus, a hybrid hierarchical routing scheme for a high density programmable logic device has been described. The routing scheme includes a first level routing architecture configured to provide intercommunication between a plurality of logic blocks of a first cluster and a second level routing architecture configured to provide limited intercommunication between the first cluster and a second cluster of logic blocks. The second level routing architecture comprises a row and column routing matrix. The row and column routing matrix may be non-segmented and/or symmetrical. The first level routing architecture may be configured to provide intercommunication between the plurality of logic blocks of a cluster and the second level routing architecture. In the foregoing discussion, specific exemplary embodiments of the present invention have been referred to in detail. It should, however, be evident that various modifications and changes may be made thereto without departing from the broader spirit and scope of the present invention as set forth in the appended claims. This specification and the accompanying drawings should, therefore, be regarded as illustrative in nature rather than restrictive.

What is claimed is:

1. A programmable logic device comprising a plurality of clusters of logic blocks, each of the logic blocks of each cluster being coupled to a respective programmable interconnect matrix, each of the clusters being coupled to others of the clusters through a row and column, non-segmented routing matrix, each row and/or column of which is directly accessible by an equal number of the clusters, such that each cluster is required to traverse an equal number of turns to access another cluster.

2. The programmable logic device of claim 1 wherein the row and column routing matrix is symmetrical to provide equivalent connectivity to the row and column.

3. The programmable logic device of claim 1 further comprising a plurality of input/output cells coupled to the row and column routing matrix.

4. The programmable logic device of claim 1 wherein the row and column routing matrix comprises a plurality of programmable interconnections.

5. The programmable logic device of claim 1 wherein each of the logic blocks comprises a plurality of macrocells.

6. The programmable logic device of claim I wherein each of the clusters includes a respective programmable interconnect matrix.

7. The programmable logic device of claim 6 wherein each of the logic blocks of each cluster is coupled to the cluster's respective programmable interconnect matrix.

8. An hierarchical routing scheme for a programmable logic device having a number of clusters of logic blocks comprising:
   a number of first level routing architectures, each configured to provide intercommunication between a plurality of logic blocks of a respective one of the clusters of the programmable logic device; and
   a second level routing architecture configured to provide limited intercommunication between the clusters of the programmable logic device, the second level routing architecture comprising a row and column routing matrix, each row of which is directly accessible by a first number of the clusters through the routing architectures of the first level and each column of which is directly accessible by a second number of the clusters through the routing architectures of the first level, such that each cluster is required to traverse an equal number of turns to access another cluster.

9. The hierarchical routing scheme of claim 8 wherein the first level routing architecture is further configured to provide intercommunication between the plurality of logic blocks and the second level routing architecture.

10. The hierarchical routing scheme of claim 8 wherein the second level routing architecture further comprises a non-segmented routing matrix.

11. The hierarchical routing scheme of claim 10 wherein the second level routing architecture is symmetrical to provide equivalent connectivity to the row and column.

12. The programmable logic device of claim 1 wherein each row and or column of the routing matrix independently comprises a plurality of lines or interconnects.

13. The programmable logic device of claim 1 wherein a number of rows accessible to each cluster equals a number of columns accessible to each cluster.

14. The programmable logic device of claim 1 wherein each row of the routing matrix is accessible by an equal number of clusters.

15. The programmable logic device of claim 1 wherein each column of the routing matrix is accessible by an equal number of clusters.

16. The programmable logic device of claim 12 wherein the number of lines or interconnects in each row and/or column is the same.

17. The hierarchical routing scheme of claim 8 wherein each row and or column of the routing matrix independently comprises a plurality of lines or interconnects.

18. The hierarchical routing scheme of claim 8 wherein the first and second numbers of clusters are different.

19. The hierarchical routing scheme of claim 8 wherein the first and second numbers of clusters are the same.

20. The hierarchical routing scheme of claim 17 wherein the number of lines or interconnects in each row and/or column is the same.

21. A programmable logic device having a plurality of clusters of logic blocks, each of the logic blocks of each cluster being coupled to a respective programmable interconnect matrix, each of the clusters being coupled to others of the clusters through a row and column, non-segmented routing matrix, each row and column of which is directly accessible by an equal number of the clusters, wherein the row and column routing matrix is symmetrical to provide equivalent connectivity to the row and column, such that each cluster is required to traverse only one turn to access another cluster.

22. A programmable logic device having a plurality of clusters of logic blocks, each of the logic blocks of each cluster being coupled to a respective programmable interconnect matrix, each of the clusters being coupled to others of the clusters through a row and column, non-segmented routing matrix, each column of which is directly accessible by an equal number of the clusters, wherein the column routing matrix is symmetrical to provide equivalent connectivity to the column, such that each cluster is required to traverse only one turn to access another cluster.

* * * * *